United States Patent [19]

Lachmann et al.

[11] Patent Number: 4,651,083

[45] Date of Patent: Mar. 17, 1987

[54] INTEGRATED CONSTANT CURRENT SOURCE

[75] Inventors: Ulrich Lachmann; Erwin Krug, both of Munich, Fed. Rep. of Germany

[73] Assignee: Siemens Aktiengesellschaft, Berlin and Munich, Fed. Rep. of Germany

[21] Appl. No.: 754,863

[22] Filed: Jul. 12, 1985

[30] Foreign Application Priority Data

Jul. 16, 1984 [DE] Fed. Rep. of Germany ....... 3426166

[51] Int. Cl.4 .......................... G05F 3/16; H03F 3/04
[52] U.S. Cl. .................................... 323/316; 330/288
[58] Field of Search ................. 323/315, 316; 330/288

[56] References Cited

FOREIGN PATENT DOCUMENTS 2844745 4/1980 Fed. Rep. of Germany .
3136780 3/1983 Fed. Rep. of Germany .

*Primary Examiner*—William B. Perkey
*Attorney, Agent, or Firm*—Herbert L. Lerner; Laurence A. Greenberg

[57] ABSTRACT

An integrated constant-current source having an operational amplifier with an inverting input to which a reference voltage is feedable, and an output; a first stage to which the output is coupled and by which the output voltage of the operational amplifier is converted to a first current, the first stage being in a circuit wherein a reference resistor is connected from which, for coupling a voltage dropping across the reference resistor, the reference resistor is coupled to a non-inverting input of the operational amplifier; and a second stage coupled to the output of the operational amplifier for converting the output voltage of the operational amplifier to a second current, the second stage being in a circuit wherein a current reflector is connected for supplying an output current which is constant in a first approximation, the integrated constant current source includes a third stage coupled to the output of the operational amplifier and converting the output voltage thereof into another current, the third stage being in a circuit wherein another current reflector is connected, and another stage coupled to the reference resistor, the other current reflector conducting reflected current and having a stage thereof connected in a circuit wherein the other stage coupled to the reference resistor is also connected.

3 Claims, 2 Drawing Figures

INTEGRATED CONSTANT CURRENT SOURCE

The invention relates to an integrated constant-current source and, more particularly, to an integrated constant-current source having an operational amplifier with an inverting input to which a reference voltage is feedable, and an output; a first stage to which the output is coupled and by which the output voltage of the operational amplifier is converted to a first current, the first stage being in a circuit wherein a reference resistor is connected from which, for coupling a voltage dropping across the reference resistor, the reference resistor is coupled to a non-inverting input of the operational amplifier; and a second stage coupled to the output of the operational amplifier for converting the output voltage of the operational amplifier to a second current, the second stage being in a circuit wherein a current reflector is connected for supplying an output current which is constant in a first approximation, the integrated constant current source.

Figure 1:
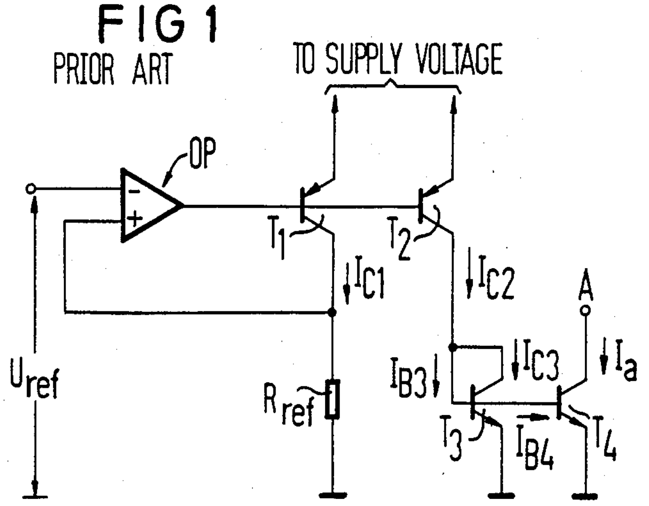
FIG 1 PRIOR ART

FIG. 1 is a basic circuit diagram of a prior-art integrated constant-current source of the general type of the invention of the instant application. Such a constant-current source contains an operational amplifier OP which compares a reference voltage $U_{ref}$ fed to the inverting input thereof with a voltage dropping across a reference resistor $R_{ref}$. For generating this voltage, a transistor stage $T_1$ which converts the output voltage of the operational amplifier OP into a corresponding current is coupled to the output of the operational amplifier OP. A collector current $I_{c1}$ of this transistor stage $T_1$ flows through the reference resistor $R_{ref}$, across which a voltage drops due to the current $I_{c1}$ flowing through it, that voltage being fed to the noninverting input of the operational amplifier OP. Due to the comparison performed by the operational amplifier OP, the transistor stage $T_1$ is addressed in such a manner that the reference voltage $U_{ref}$ and the voltage dropping across the reference resistor $R_{ref}$ are equal. Thereby, the product of the collector current $I_{c1}$ of the transistor stage $T_1$ and the value of the reference resistor $R_{ref}$ is equal to the reference voltage $U_{ref}$. This means that the collector current $I_{c1}$ also is constant.

As shown schematically in FIG. 1, the emitter of the transistor stage $T_1$ as well as the emitter of a transistor stage $T_2$ to be described in greater detail hereinafter lead with further wiring to a supply voltage. A constant current relative to the supply voltage could be taken off the hereinaforedescribed constant-current source. For many applications of a constant-current source such as is under discussion, it would be desirable however to take off the constant current relative to reference potential (ground).

For this purpose, the further transistor stage $T_2$ is coupled to the output of the operational amplifier OP; in the circuit of the collector-emitter path of the further transistor stage $T_2$, a current reflector or current mirror formed by transistors $T_3$, $T_4$ is disposed relative to reference potential (ground). This current reflector is formed by a reference transistor $T_3$ which is connected as a diode and disposed in the collector-emitter circuit of the transistor stage $T_2$, as well as by a transistor $T_4$ controlled by the reference transistor $T_3$, wherein a constant output current $I_a$ flows through the last-mentioned transistor $T_4$ and an output A of the constant-current source, via a non-illustrated consumer coupled to the output A.

For the collector current $I_{c2}$ of the transistor stage $T_2$ and, thereby, for the output current $I_a$, due to the known operation of the current reflector $T_3$, $T_4$, the same relationships apply, as were described above, for the collector current $I_{c1}$ of the transistor stage $T_1$.

The constancy of the current and, especially, of the output current $I_a$ applies only in a first approximation, however. If one looks at the current ratio, for example, in the per-mil or per-thousandths range in greater detail, it is found that the constancy of the output current $I_a$ is not accurate enough for many applications. A part of the collector current $I_{c2}$ supplied by the transistor stage $T_2$ is lost, which is necessary as a driving current in the form of base currents $I_{B3}$ and $I_{B4}$ for driving the current reflector transistors $T_3$, $T_4$. In particular, the aforementioned base currents depend on the current gains of the current reflector transistors $T_3$, $T_4$ which can have a wide spread which enters into the output current $I_a$, accordingly. This effect is enhanced further if, for adjusting a given output current $I_a$, an emitter and/or collector area ratio of 1:n is chosen in the current reflector for the transistors $T_3$ and $T_4$ i.e. the emitter and/or collector area of the transistor $T_4$ is n-times larger than the emitter and/or collector area of transistor $T_3$.

The constancy of the output current is furthermore affected adversely by the so-called Early effect which is concerned with the fact that, in the active part of the family of characteristics of the transistor, the collector current is not independent of the collector-emitter voltage, i.e. it is horizontal in the family of characteristics, but rather, likewise rises with increasing collector-emitter voltage.

It is therefore an object of the invention to provide, in an integrated constant-current source of the foregoing general type, a circuit for compensating for variations of the output current due to the base currents in the current reflector, this circuit being simultaneously usable for compensating for the Early effect.

With the foregoing and other objects in view, there is thus provided, in accordance with the invention an integrated constant-current source having an operational amplifier with an inverting input to which a reference voltage is feedable, and an output; a first stage to which the output is coupled and by which the output voltage of the operational amplifier is converted to a first current, the first stage being in a circuit wherein a reference resistor is connected from which, for coupling a voltage dropping across the reference resistor, the reference resistor is coupled to a non-inverting input of the operational amplifier; and a second stage coupled to the output of the operational amplifier for converting the output voltage of the operational amplifier to a second current, the second stage being in a circuit wherein a current reflector is connected for supplying an output current which is constant in a first approximation, the integrated constant current source includes a third stage coupled to the output of the operational amplifier and converting the output voltage thereof into another current, the third stage being in a circuit wherein another current reflector is connected, and another stage coupled to the reference resistor, the other current reflector conducting reflected current and having a stage thereof connected in a circuit wherein the other stage coupled to the reference resistor is also connected.

In accordance with a further feature of the invention, the first-mentioned current reflector has a stage conducting the output current which is constant in a first approximation, and including another operational amplifier connected as a voltage follower, the stage of the first-mentioned current reflector being coupled via the other operational amplifier to the other stage coupled to the reference resistor.

In accordance with an added feature of the invention, the other stage coupled to the reference resistor is formed of a transistor having a collector-emitter path disposed in the circuit of the stage of the other current-reflector conducting reflected current, and having a base by which the transistor is connected to the reference resistor.

In accordance with a concomitant feature of the invention of the instant application, the first-mentioned current reflector is formed of a reference transistor connected as a diode, and a transistor controlled by the reference transistor and conducting the output current constant in a first approximation, the reference transistor and the transistor conducting the output current having an emitter and/or collector-surface ratio of 1:n, where n is a value greater than 1, and wherein the transistor coupled to the reference resistor has an emitter and/or collector-surface n times the emitter and/or collector-surface of the reference transistor of the first-mentioned current reflector, the other current reflector also having a reference transistor connected as a diode, the stage of the other current reflector being a transistor conducting the reflected current and having an emitter and/or collector-surface ratio of 1:(n+1).

Other features which are considered as characteristic for the invention are set forth in the appended claims.

Although the invention is illustrated and described herein as embodied in integrated constant-current source, it is nevertheless not intended to be limited to the details shown, since various modifications and structural changes may be made therein without departing from the spirit of the invention and within the scope and range of equivalents of the claims.

Figure 2:
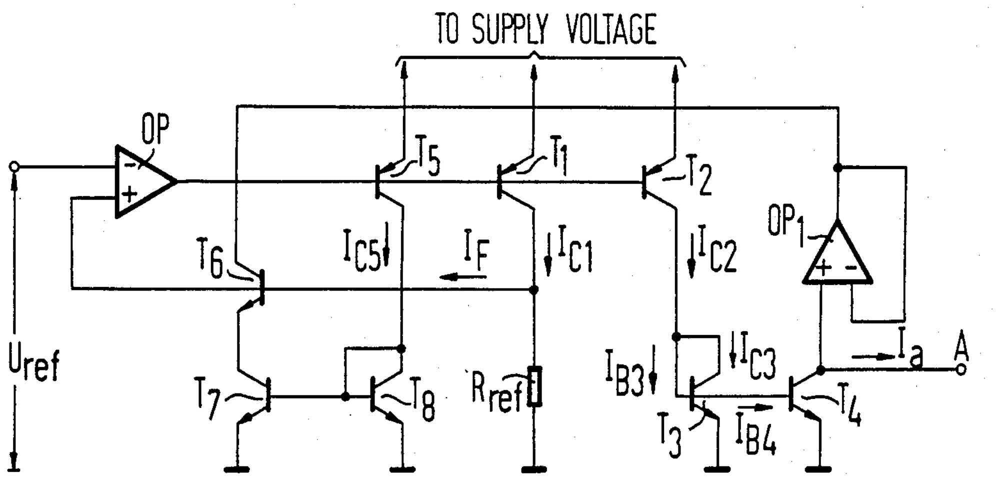

The construction and method of operation of the invention, however, together with additional objects and advantages thereof will be best understood from the following description of specific embodiments when read in connection with the accompanying drawing, in which:

FIG. 1 as aforedescribed, is a circuit diagram of a conventional or prior-art embodiment of an integrated constant-current source; and FIG. 2 is a circuit diagram of an integrated constant-current source which is of the same general type as that shown in FIG. 1, but expanded and advanced, however, in accordance with the invention.

Like elements are provided with the same reference characters in FIGS. 1 and 2.

With respect to the operational amplifier part, the reference circuit $T_1$, $R_{ref}$ and the current reflector or current mirror circuit $T_2$, $T_3$, $T_4$, the circuit arrangement according to FIG. 2 conforms entirely with the circuit arrangement according to FIG. 1, so that, in regard to FIG. 2, reference can be made to the foregoing corresponding description of the circuit arrangement according to FIG. 1 for an explanation thereof.

The circuit arrangement according to FIG. 2 contains a further current reflector or current mirror $T_7$, $T_8$, and the collector-emitter circuit of a control transistor $T_7$ of this current reflector $T_7$, $T_8$ contains a transistor $T_6$ which is coupled by its base to the reference transistor $R_{ref}$. Via this transistor $T_6$, which converts the voltage across the resistor $R_{ref}$ into a corresponding current, the current reflector $T_7$, $T_8$ acquires a current which likewise includes the fault produced by the base currents of the transistors $T_7$, $T_8$. This fault current is identified as $I_F$ in FIG. 2. Assuming that the characteristics of the transistors $T_3$, $T_4$ of the first current reflector and or the transistors $T_7$, $T_8$ correspond to one another, the same fault due to the base current is therefore generated in the second current reflector $T_7$, $T_8$, as is caused by the base currents $I_{B3}$, $I_{B4}$ in the first current reflector $T_3$, $T_4$.

In monolithically integrated technology, it is practically always true that the properties or characteristics of the aforementioned transistors fundamentally agree with one another. At least, however, it is possible, with a very good yield, to exclude by appropriately accurate measurements those samples, in which the transistors $T_3$, $T_4$ of the first current reflector and $T_7$, $T_8$ of the second or other current reflector are not "paired" sufficiently well.

Because the fault current corresponding to the base currents in the current reflector $T_7$, $T_8$ is thus subtracted from the collector current $I_{c1}$ flowing through the reference resistor $R_{ref}$, of the transistor stage $T_1$ i.e., from the reference current, a very small resulting error, if any at all, occurs in the output current $I_a$. It follows from the explanations given hereinbefore that, for the faults due to the base currents in a current reflector, compensation could be made solely by bringing the transistor $T_6$, like the transistors $T_1$, $T_2$ and $T_5$, to the supply voltage. The circuit arrangement according to the invention as shown in FIG. 2, however, has the further advantage that by compensating for the aforementioned faults due to the base currents in a current reflector, it also is possible to compensate simultaneously for faults due to the Early effect of the current-reflector transistors. The latter faults result from the fact that the collectors of the transistors $T_3$, $T_4$ of the first current reflector can have different potentials due to the Early effect.

In order to compensate for this fault, at the same time, the transistor stage $T_4$ which conducts the output current $I_a$ which, through constant, still has faults due to the Early effect, is coupled to the transistor stage $T_6$ coupled to the reference resistor $R_{ref}$ via a further operational amplifier $OP_1$ connected as a voltage follower. This transistor $T_6$ is connected by the collector-emitter path thereof in the circuit of the reflected-current conducting transistor stage $T_7$ of the second or other current reflector $T_6$, $T_7$, and the transistor $T_6$ is connected to the base thereof to the reference transistor $R_{ref}$. Because an operational amplifier which is connected as a voltage follower (by feedback of the output thereof to the inverting input) has a voltage gain 1, the same voltage is present at the collector of the transistor $T_6$ as at the collector of the output-current conducting transistor $T_4$ of the first current reflector $T_3$, $T_4$, so that the same Early effect is operative at the transistor $T_6$, compensation for faults in the output current $I_a$ due to the early effect being thus realized.

If, as mentioned in the introduction hereto in regard to the circuit arrangement according to FIG. 1, a first current reflector $T_3$, $T_4$ is selected for adjusting a given value of the output current $I_a$, in which the reference transistor $T_3$ connected as a diode and the transistor $T_4$ which is controlled by the latter and carries the (reflected) constant output current $I_a$ have an emitter and-/or collector area ratio of 1:n, there is provided in a further embodiment of the invention, wherein this area ratio is taken into consideration, that the transistor T which is coupled to the reference resistor $R_{ref}$ and the further operational amplifier $OP_1$, has n-times the emitter and/or collector area of the reference transistor $T_3$ of the first current reflector $T_3$, $T_4$, and a transistor $T_8$ which is connected as a diode and acts as a reference transistor, as well as the transistor $T_7$, carrying the reflected current, of the second or other current reflector $T_7$, $T_8$, have an emitter and/or collector area ratio of 1:(n+1). Thereby, the compensating effect is attained also for an output current $I_a$ determined by the ratio n.

The foregoing is a description corresponding, in substance, to German application No. P 34 26 166.4, dated July 16, 1984, International priority of which is being claimed for the instant application, and which is hereby made part of this application. Any material discrepancies between the foregoing specification and the specification of the aforementioned corresponding German application are to be resolved in favor of the latter.

There is claimed:

1. An integrated constant-current source having an operational amplifier with an inverting input to which a reference voltage is feedable, and an output; a first stage to which the output is coupled and by which the output voltage of the operational amplifier is converted to a first current, the first stage being in a circuit wherein a reference resistor is connected from which, for coupling a voltage dropping across the reference resistor, the reference resistor is coupled to a non-inverting input of the operational amplifier; and a second stage coupled to the output of the operational amplifier for converting the output voltage of the operational amplifier to a second current, the second stage being in a circuit wherein a current mirror is connected for supplying an output current which is constant in a first approximation, the integrated constant current source comprising a third stage coupled to the output of the operational amplifier and converting the output voltage thereof into another current, said third stage being in a circuit wherein another current mirror is connected, and another stage coupled to the reference resistor, said other current mirror conducting reflected current and having a stage thereof connected in a circuit wherein said other stage coupled to the reference resistor is also connected.

2. Integrated constant-current source according to claim 1 wherein the first-mentioned current mirror has a stage conducting the output current which is constant in a first approximation, and including another operational amplifier connected as a voltage follower, said stage of said first-mentioned current mirror being coupled via said other operational amplifier to said other stage coupled to the reference resistor.

3. Integrated constant-current source according to claim 1 wherein said other stage coupled to the reference resistor is formed of a transistor having a collector-emitter path disposed in said circuit of said stage of said other current-mirror conducting reflected current, and having a base by which said transistor is connected to the reference resistor.

* * * * *